(12) United States Patent
Hoshi et al.

(10) Patent No.: US 10,147,792 B2
(45) Date of Patent: *Dec. 4, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yasuyuki Hoshi, Matsumoto (JP); Yuichi Harada, Matsumoto (JP); Takashi Shiigi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/692,690

(22) Filed: Aug. 31, 2017

(65) Prior Publication Data

US 2018/0006122 A1 Jan. 4, 2018

Related U.S. Application Data

(63) Continuation of application No. PCT/JP2016/073366, filed on Aug. 8, 2016.

(30) Foreign Application Priority Data

Sep. 17, 2015 (JP) .................................. 2015-184247

(51) Int. Cl.
*H01L 29/16* (2006.01)
*H01L 23/48* (2006.01)
(Continued)

(52) U.S. Cl.
CPC ...... *H01L 29/1608* (2013.01); *H01L 21/0465* (2013.01); *H01L 21/0485* (2013.01);
(Continued)

(58) Field of Classification Search
CPC ........... H01L 29/1608; H01L 29/41741; H01L 29/0696; H01L 29/66088; H01L 29/51; H01L 29/7802; H01L 29/7395
See application file for complete search history.

(56) References Cited

U.S. PATENT DOCUMENTS 6,054,752 A * 4/2000 Hara ................... H01L 29/0611
257/629
2015/0115285 A1 4/2015 Kinoshita et al.
2017/0141222 A1* 5/2017 Harada ............... H01L 29/1095

FOREIGN PATENT DOCUMENTS

JP 2000-012845 A 1/2000
JP 2004-207509 A 7/2004
(Continued)

OTHER PUBLICATIONS

K. Shenai, et al, "Optimum Semiconductors for High-Power Electronics", IEEE Transactions on Electron Devices, vol. 36, No. 9, Sep. 1989, pp. 1811-1823.

(Continued)

*Primary Examiner* — William Coleman
(74) *Attorney, Agent, or Firm* — Rabin & Berdo, P.C.

(57) ABSTRACT

A semiconductor device, including a substrate, a deposition layer deposited on the substrate, a semiconductor region selectively provided in the deposition layer, a semiconductor layer provided on the deposition layer and the semiconductor region, a first region and a second region selectively provided in the semiconductor layer, a gate electrode provided on the second region and the semiconductor layer via a gate insulating film, a source electrode in contact with the semiconductor layer and the second region, an interlayer insulating film covering the gate electrode, a drain electrode provided on the substrate, a plating film selectively provided on the source electrode at portions thereof on which the protective film is not provided, and a pin-shaped electrode (Continued)

connected to the plating film via solder. The second region is not formed directly beneath a portion where the plating film, the protective film and the source electrode are in contact with one another.

4 Claims, 3 Drawing Sheets

(51) Int. Cl.

| | |
|---|---|
| *H01L 29/78* | (2006.01) |
| *H01L 29/06* | (2006.01) |
| *H01L 29/417* | (2006.01) |
| *H01L 29/51* | (2006.01) |
| *H01L 29/66* | (2006.01) |
| *H01L 21/04* | (2006.01) |
| *H01L 29/10* | (2006.01) |
| *H01L 29/739* | (2006.01) |

(52) U.S. Cl.
CPC .......... *H01L 23/48* (2013.01); *H01L 29/0696* (2013.01); *H01L 29/1095* (2013.01); *H01L 29/41741* (2013.01); *H01L 29/51* (2013.01); *H01L 29/66068* (2013.01); *H01L 29/78* (2013.01); *H01L 29/7802* (2013.01); *H01L 29/417* (2013.01); *H01L 29/7395* (2013.01)

(56) References Cited

FOREIGN PATENT DOCUMENTS

| | | |
|---|---|---|
| JP | 2012-054294 A | 3/2012 |
| JP | 2012-191010 A | 10/2012 |
| JP | 2013-232564 A | 11/2013 |
| JP | 2014-099444 A | 5/2014 |

OTHER PUBLICATIONS

B. Jayant Baliga, et al, "Silicon Carbide Power Devices", USA, World Scientific Publishing Co., Mar. 30, 2006, p. 61-69.

\* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2016/073366, filed on Aug. 8, 2016, which claims priority from a Japanese Patent Application No. 2015-184247, filed on Sep. 17, 2015, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Silicon (Si) has been used as a constituent material of power semiconductor devices that control high voltage and/or large current. There are several types of power semiconductor devices such as bipolar transistors, insulated gate bipolar transistors (IGBTs), metal oxide semiconductor field effect transistors (MOSFETs), etc. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Nonetheless, there is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pp. 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to other semiconductor materials having a bandgap greater than silicon (hereinafter, wide bandgap semiconductor), such as gallium nitride (GaN). Thus, a high-voltage semiconductor device having low resistance can be achieved by using a wide bandgap semiconductor material (see, for example, B. Jayant Baliga, et al, "Silicon Carbide Power Devices", USA, World Scientific Publishing Co., 2006, Mar. 30, p. 61).

With such high-voltage semiconductor devices using silicon carbide, when used in an inverter, the extent to which occurring loss is reduced, the carrier frequency may be used for frequency applications 10 times higher than that of a conventional semiconductor device using silicon. Further, when a semiconductor device is used for a high frequency application, generated heat increases the chip temperature, affecting the reliability of the semiconductor device. In particular, a bonding wire is bonded to a front electrode on a substrate front surface side as a wiring member to carry the potential of the front electrode to the outside and when the semiconductor device is used at high temperatures, adhesion of the front electrode and the bonding wire decreases, affecting reliability.

Further, other than wiring bonding, there is a technique of using a plate conductor member as a wiring member to carry the potential of the front electrode to the outside (for example, refer to Japanese Laid-Open Patent Publication No. 2014-99444).

In one conventional silicon carbide semiconductor device, a pin-shaped electrode is bonded to the front electrode by solder. FIG. 3 is a cross-sectional view of a structure of the conventional silicon carbide semiconductor device. On a surface of an $n^+$-type silicon carbide substrate 1, an n-type silicon carbide epitaxial layer 2 is deposited, and a $p^+$-type region 10 is provided in plural in a surface of the n-type silicon carbide epitaxial layer 2. On surfaces of the $p^+$-type regions 10, a p-type silicon carbide epitaxial layer 11 is provided. In the p-type silicon carbide epitaxial layer 11 on the n-type silicon carbide epitaxial layer 2, an n-type well region 12 is provided where the $p^+$-type region 10 is not provided. In the surface of the p-type silicon carbide epitaxial layer 11, $n^+$-type source regions 4 and $p^{++}$-type contact regions 5 are provided.

On a surface of the p-type silicon carbide epitaxial layer 11, a gate electrode 7 is provided between the $n^+$-type source region 4 and the n-type well region 12, via a gate insulating film 6, and on a top of the gate electrode 7, a Phosphosilicate Glass (PSG) film 14 is selectively provided as an interlayer insulating film 13. On surfaces of the $n^+$-type source regions 4 and the $p^{++}$-type contact regions 5, a source electrode 8 is provided. The source electrode 8, for example, is a 2-layered structure of a Ti film 20 and an Al—Si film 21. On a top of the source electrode 8, a protective film 15 is selectively provided and at portions where the protective film 15 is not provided, a plating film 16 is provided.

A second protective film 17 is provided so as to cover a portion where the plating film 16 and the protective film 15 are adjacent to each other. Solder 19 is provided connecting a pin-shaped electrode 18 to the plating film 16 portion, the pin-shaped electrode 18 is connected to an external signal. On a rear surface side of the $n^+$-type silicon carbide substrate 1, a drain electrode 9 is provided.

In the MOSFET of the structure depicted in FIG. 3, when voltage less than a gate threshold is applied to the gate electrode 7 in a state where positive voltage is applied to the drain electrode 9 with respect to the source electrode 8, a pn junction of the p-type silicon carbide epitaxial layer 11 and the n-type well region 12 is reverse biased, the breakdown voltage of the active region is secured and current does not flow. On the other hand, when voltage equal to or higher than the gate threshold is applied to the gate electrode 7, an inversion layer is formed at the surface of the p-type silicon carbide epitaxial layer 11 directly beneath the gate electrode 7 whereby current flows. In this manner, switching operation of the MOSFET may be performed by the voltage applied to the gate electrode 7.

SUMMARY OF THE INVENTION

According to one aspect of the present invention, a semiconductor device includes a first-conductivity-type wide bandgap semiconductor substrate including a semiconductor material having a bandgap wider than that of silicon; a first-conductivity-type wide bandgap semiconductor deposition layer deposited on a front surface of the first-conductivity-type wide bandgap semiconductor substrate and having an impurity concentration lower than that of the first-conductivity-type wide bandgap semiconductor substrate; a second-conductivity-type semiconductor region selectively provided in a first side of the first-conductivity-type wide bandgap semiconductor deposition layer opposite a second side of the first-conductivity-type wide bandgap semiconductor deposition layer facing the first-conductivity-type wide bandgap semiconductor substrate; a second-conductivity-type wide bandgap semiconductor layer provided on surfaces of the first-conductivity-type wide bandgap semiconductor deposition layer and the second-conductivity-type semiconductor region and including a semiconductor material having a bandgap wider than that of silicon; a first first-conductivity-type region selectively provided on the first-conductivity-type wide bandgap semiconductor deposition layer and in the second-conductivity-type wide bandgap semiconductor layer; a second first-conductivity-type region selectively provided in the second-conductivity-type wide bandgap semiconductor layer; a gate electrode provided on the second first-conductivity-type region and the second-conductivity-type wide bandgap semiconductor layer via a gate insulating film; a source electrode in contact with the second-conductivity-type wide bandgap semiconductor layer and the second first-conductivity-type region; an interlayer insulating film covering the gate electrode; a drain electrode provided on a rear surface of the first-conductivity-type wide bandgap semiconductor substrate; a protective film selectively provided on the source electrode; a plating film selectively provided on the source electrode at portions where the protective film is not provided; and a pin-shaped electrode connected to the plating film via solder, the pin-shaped electrode taking out an external signal. Directly beneath a triple junction portion where the plating film, the protective film, and the source electrode are in contact with each other, no channel is provided.

In the semiconductor device, no channel is provided directly beneath the triple junction portion means: the second-conductivity-type semiconductor region is provided in a surface layer of the first-conductivity-type wide bandgap semiconductor deposition layer, the first first-conductivity-type region is provided in the second-conductivity-type wide bandgap semiconductor layer, and the second first-conductivity-type region is not provided in the second-conductivity-type wide bandgap semiconductor layer.

According to another aspect of the present invention, a method of manufacturing a semiconductor device includes forming a first-conductivity-type wide bandgap semiconductor deposition layer on a front surface of a first-conductivity-type wide bandgap semiconductor substrate including a semiconductor material having a bandgap wider than that of silicon, the first-conductivity-type wide bandgap semiconductor deposition layer having an impurity concentration lower than that of the first-conductivity-type wide bandgap semiconductor substrate; selectively forming a second-conductivity-type semiconductor region in a surface layer of the first-conductivity-type wide bandgap semiconductor deposition layer; forming a second-conductivity-type wide bandgap semiconductor layer on a surface of the first-conductivity-type wide bandgap semiconductor deposition layer, the second-conductivity-type wide bandgap semiconductor layer including a semiconductor material having a bandgap wider than that of silicon; selectively forming a first first-conductivity-type region in the second-conductivity-type wide bandgap semiconductor layer so as to be on the first-conductivity-type wide bandgap semiconductor deposition layer; selectively forming a second first-conductivity-type region in the second-conductivity-type wide bandgap semiconductor layer; forming a gate electrode on the second first-conductivity-type region and the second-conductivity-type wide bandgap semiconductor layer, via a gate insulating film; forming a source electrode in contact with the second-conductivity-type wide bandgap semiconductor layer and the second first-conductivity-type region; forming an interlayer insulating film covering the gate electrode; forming a drain electrode on a rear surface of the first-conductivity-type wide bandgap semiconductor substrate; selectively forming a protective film on the source electrode; selectively forming a plating film on the source electrode, at a portion where the protective film is not formed; and forming a pin-shaped electrode connected to the plating film via solder, the pin-shaped electrode taking out an external signal. The second first-conductivity-type region is selectively formed so that no channel is formed directly beneath a triple junction portion where the plating film, the protective film, and the source electrode are in contact with each other.

In the method, selectively forming the second first-conductivity-type region so that no channel is formed directly beneath the triple junction portion means: forming the second-conductivity-type semiconductor region in a surface layer of the first-conductivity-type wide bandgap semiconductor deposition layer, forming the first first-conductivity-type region in the second-conductivity-type wide bandgap semiconductor layer, and not forming the second first-conductivity-type region in the second-conductivity-type wide bandgap semiconductor layer.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
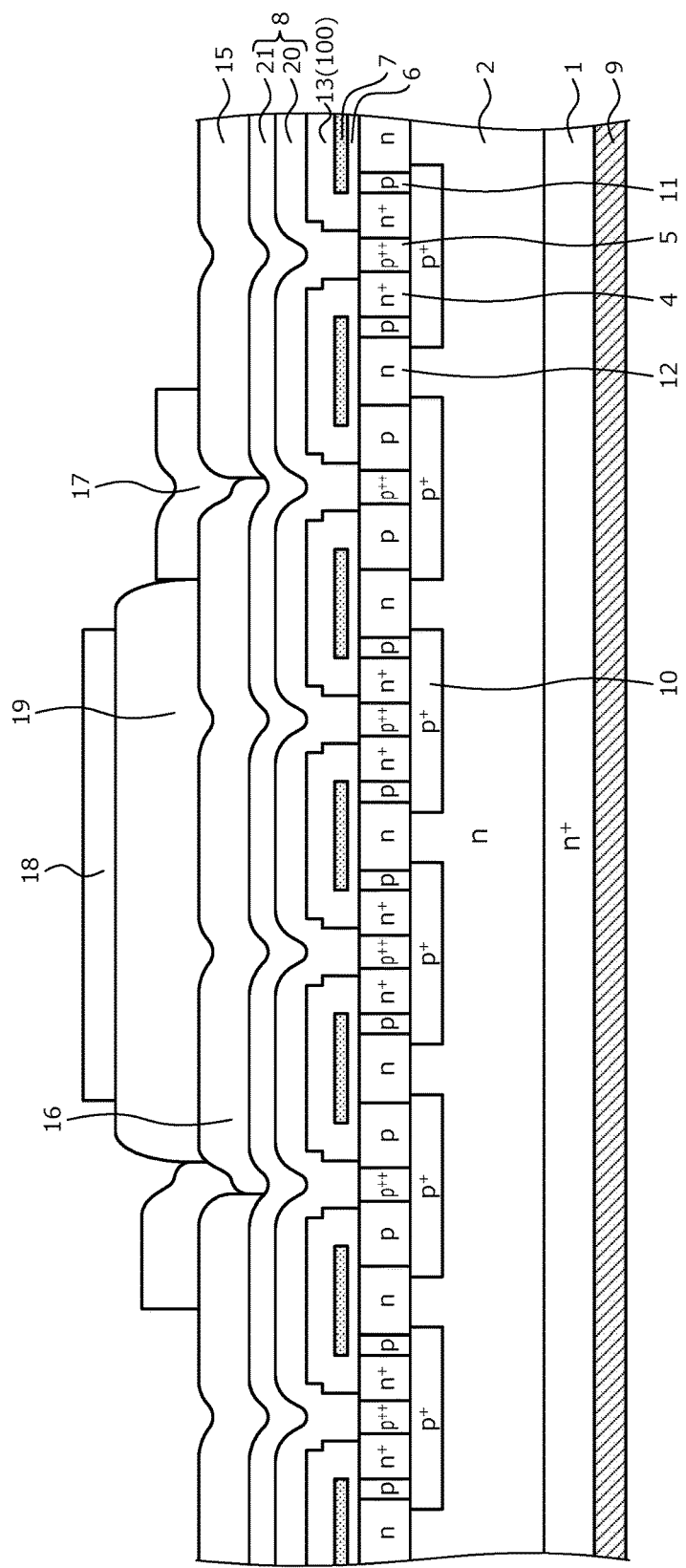
FIG. 1 is a cross-sectional view of a silicon carbide semiconductor device according to an embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "-" to the index.

First, problems related to the convention structure will be discussed. With a conventional structure, coverage (step portion coverage) of the interlayer insulating film 13 is poor and in the surface of the interlayer insulating film 13, a step portion is generated consequent to underlying layers not being level. As a result, when the pin-shaped electrode 18 is solder bonded to the source electrode 8 via the plating film 16, stress concentrates and is placed on the step portion of the interlayer insulating film 13. Here, the step portion of the interlayer insulating film 13 results from the interlayer insulating film 13 covering the gate electrode 7, and a height of the interlayer insulating film 13 is from a silicon carbide semiconductor base, which is the $n^+$-type silicon carbide substrate 1 and the n-type silicon carbide epitaxial layer 2 combined. Further, at the time of solder bonding of the pin-shaped electrode 18 and/or at the time of switching of the semiconductor device, the temperature difference of the solder 19 and periphery becomes large near an end portion of the solder 19, particularly, at a triple junction portion where the plating film 16, the protective film 15, and the source electrode 8 are in contact with each other, stress resulting from differences in thermal expansion concentrates. Consequent to the concentration of stress in this manner, characteristics of the semiconductor device degrade and reliability decreases. In a worst case, the interlayer insulating film 13 cracks, the gate electrode 7 and the source electrode 8 short, and semiconductor device fails.

A semiconductor device according to the present invention is configured using a wide bandgap semiconductor. In the present embodiment, a MOSFET will be described as an example of a silicon carbide semiconductor device produced using, for example, silicon carbide (SiC) as a wide bandgap semiconductor. FIG. 1 is a cross-sectional view of a silicon carbide semiconductor device according to the embodiment. FIG. 1 depicts a state of an active region.

As depicted in FIG. 1, in the silicon carbide semiconductor device according to the embodiment, the n-type silicon carbide epitaxial layer (first-conductivity-type wide bandgap semiconductor deposition layer) 2 is deposited on a first main surface (front surface) of the $n^+$-type silicon carbide substrate (first-conductivity-type wide bandgap semiconductor substrate) 1.

The $n^+$-type silicon carbide substrate 1 is a silicon carbide single crystal substrate doped with, for example, nitrogen (N). The n-type silicon carbide epitaxial layer 2 is a low-concentration n-type drift layer doped with, for example, nitrogen and has an impurity concentration that is lower than that of the $n^+$-type silicon carbide substrate 1. Hereinafter, the $n^+$-type silicon carbide substrate 1 and the n-type silicon carbide epitaxial layer 2 combined will be regarded as a silicon carbide semiconductor base.

On a front surface side of the silicon carbide semiconductor base, a MOS gate (insulated gate constituting a metal oxide film semiconductor) structure (element structure) is formed. In particular, in a surface layer on a front surface side of the n-type silicon carbide epitaxial layer 2 (front surface side of the silicon carbide semiconductor base) opposite a rear surface side facing the $n^+$-type silicon carbide substrate 1, the $p^+$-type region (second-conductivity-type semiconductor region) 10 functioning as a p-type base layer is selectively provided.

On surfaces of the n-type silicon carbide epitaxial layer 2 and the $p^+$-type regions 10, the p-type silicon carbide epitaxial layer (second-conductivity-type wide bandgap semiconductor layer) 11 is deposited. Further, in a portion of the p-type silicon carbide epitaxial layer 11 on the n-type silicon carbide epitaxial layer 2, the n-type well region (first first-conductivity-type region) 12 is provided penetrating the p-type silicon carbide epitaxial layer 11 in a depth direction and reaching the n-type silicon carbide epitaxial layer 2. The n-type well region 12 constitutes the n-type silicon carbide epitaxial layer 2 and a drift region.

In portions of the p-type silicon carbide epitaxial layer 11 facing the $p^+$-type regions 10 in the depth direction, the $n^+$-type source region (second first-conductivity-type region) 4 is selectively provided away from the n-type well region 12. Further, the $p^{++}$-type contact region (second-conductivity-type region) 5 having an impurity concentration higher than that of the p-type silicon carbide epitaxial layer 11 is selectively provided in the p-type silicon carbide epitaxial layer 11, between the $n^+$-type source regions 4.

On a surface of the p-type silicon carbide epitaxial layer 11, the gate electrode 7 is provided between the $n^+$-type source region 4 and the n-type well region 12, via the gate insulating film 6. The gate electrode 7 may be provided on a surface of the n-type well region 12 via the gate insulating film 6.

The interlayer insulating film 13 is provided on the front surface side of the silicon carbide semiconductor base overall so as to cover the gate electrode 7. For example, a borophosphosilicate glass (BPSG) film 100 may be deposited as the interlayer insulating film 13.

The source electrode 8 is provided in contact with the $n^+$-type source regions 4 and the $p^{++}$-type contact regions 5 via contact holes opened in the interlayer insulating film 13 and is electrically connected to the $n^+$-type source regions 4 and the $p^{++}$-type contact regions 5. The source electrode 8, for example, may be a 2-layered structure including the Ti film 20 and the Al—Si film 2. The Al—Si film 21, for example, is an aluminum film containing silicon at a rate of 1%.

Further, on the rear surface of the silicon carbide semiconductor base, the drain electrode 9 is provided. On the source electrode 8, the protective film 15 is selectively provided and on the source electrode 8 where the protective film 15 is not provided, the plating film 16 is provided. The protective film 15 has a function of protecting the front surface of the semiconductor device. Further, when the plating film 16 is formed, the protective film 15 has a function of preventing plating of the plating film 16 from flowing outside. The protective film 15 has a further function of protecting an edge termination structure region (not depicted) surrounding a periphery of the active region. Here, the active region is a region through which current flows when the semiconductor device is in an ON state. The edge termination structure region is a region provided so as to surround the perimeter of the active region. The edge termination structure region mitigates the electric field on the substrate front surface side of the drift region and maintains the breakdown voltage.

The second protective film 17 is provided so as to selectively cover a portion where the plating film 16 and the protective film 15 are in contact with each other. The second protective film 17 covers a space between the plating film 16 and the protective film 15 and, for example, has a function of preventing the solder 19 and the like from entering the base side. The second protective film 17 functions as a mask when the solder 19 is formed. The second protective film 17 may cover the entire surface of the protective film 15. The pin-shaped electrode 18, which is a wiring member that carries the potential of the source electrode 8 to the outside, is provided connected to the plating film 16 portion via the solder 19. The pin-shaped electrode 18 has a pin shape and is bonded in an upright position to the source electrode 8.

Stress when the pin-shaped electrode 18 is solder bonded to the source electrode 8 and stress consequent to differences in thermal expansion concentrate at a step portion directly beneath the triple junction portion. In other words, a step portion in a region not directly beneath the triple junction portion is not subject to the stress. Therefore, at the step portion in the region not directly beneath the triple junction portion, the characteristics of the semiconductor device do not degrade and the reliability does not decrease. Further, the interlayer insulating film 13 does not crack, the gate electrode 7 and the source electrode 8 do not short, and the semiconductor device does not fail.

Therefore, in the present embodiment, no MOS structure channel is formed directly beneath the triple junction portion where the plating film 16, the protective film 15, and the source electrode 8 are in contact with each other. Further, directly beneath the triple junction portion means a vicinity of an intersection where the p-type silicon carbide epitaxial layer 11 and a straight line that is downward from the triple junction portion and orthogonal to the silicon carbide semiconductor base side intersect. Further, the vicinity is a region that encompasses a distance 3 times the size of a cell, from the intersection. For example, assuming the size of a cell is about 10 μm, the region encompasses a distance of about 30 μm from the intersection.

Figure 2:
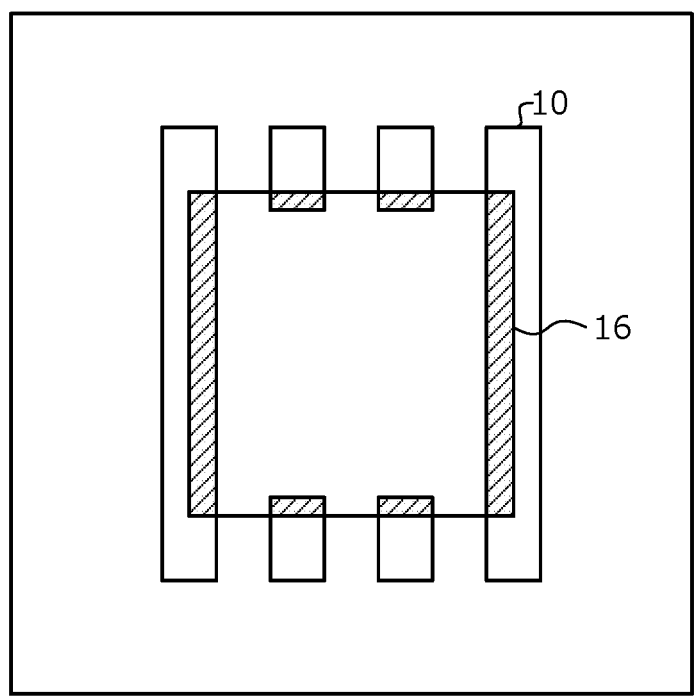
FIG. 2 is a plan view of parts of the silicon carbide semiconductor device according to the embodiment.
Figure 3:
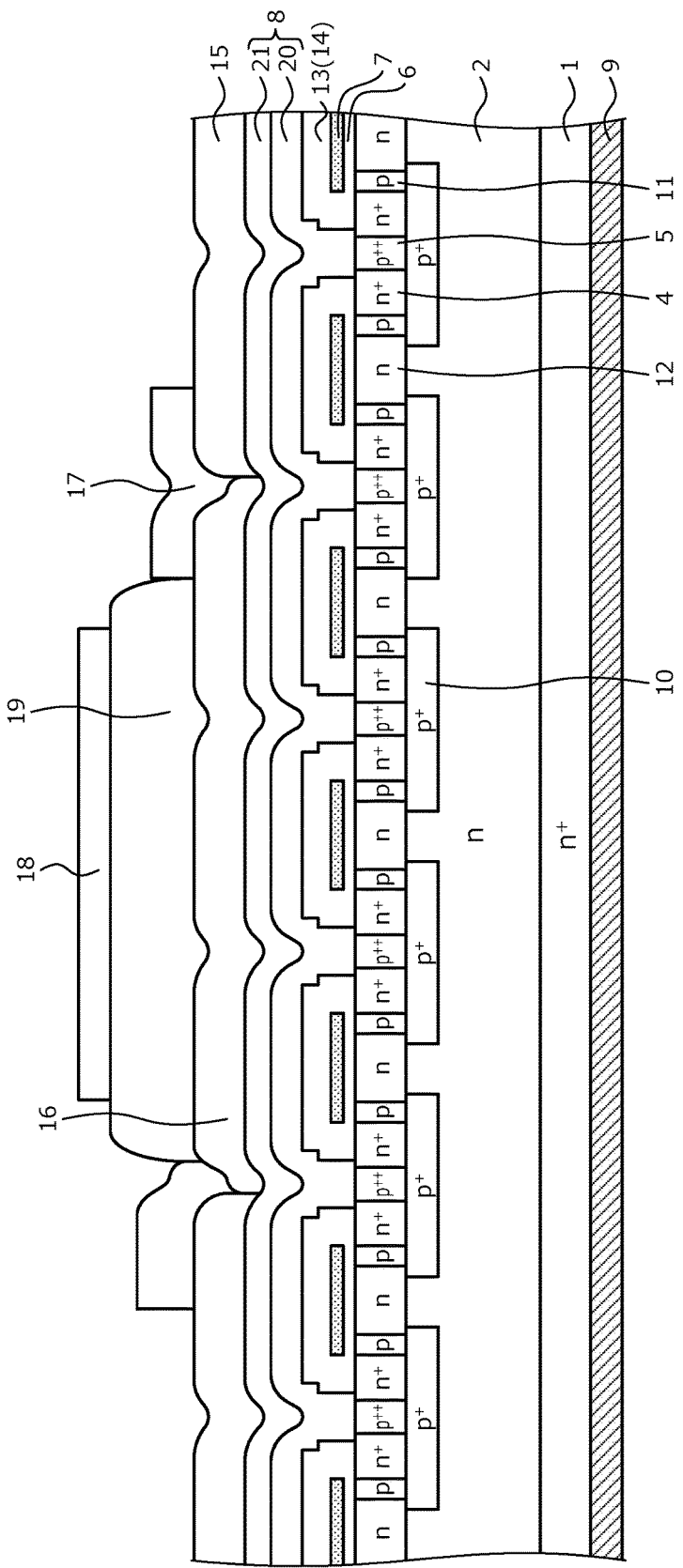
FIG. 3 is a cross-sectional view of a structure of a conventional silicon carbide semiconductor device.

FIG. 2 is a plan view of parts of the silicon carbide semiconductor device according to the embodiment. FIG. 2 depicts a part of the silicon carbide semiconductor device according to the embodiment having a surface structure that is a striped structure and in which no MOS structure channel is formed. In FIG. 2, only the $p^+$-type regions 10 and the plating film 16 are depicted. The triple junction portion where the plating film 16, the protective film 15, and the source electrode 8 are in contact with each other is a boundary portion of the plating film 16 and the protective film 15. In FIG. 2, the triple junction portion is indicated by hatched regions of the $p^+$-type regions 10 and on a surface of these regions no MOS structure channel is provided.

For example, in the surface of the n-type silicon carbide epitaxial layer 2, the $p^+$-type regions 10 are provided and between the n-type well region 12 and the $p^{++}$-type contact region 5, the $n^+$-type source region 4 is not provided whereby no MOS structure channel is formed.

Since no MOS structure channel is formed, even when voltage equal to or higher than the threshold of the gate electrode 7 is applied, current does not flow. For example, the $n^+$-type source region 4 is not provided between the n-type well region 12 and the $p^{++}$-type contact region 5. As a result, even when voltage equal to or higher than the threshold of the gate electrode 7 is applied and an inversion layer is formed in the p-type silicon carbide epitaxial layer 11, since no n-type semiconductor layer is in the contact region, no current flows directly beneath the triple junction portion.

The method of manufacturing a semiconductor device according to the embodiment will be described, taking as an example, a case in which 1200V MOSFET is produced.

First, for example, the $n^+$-type silicon carbide substrate 1 doped with nitrogen to have an impurity concentration of about $2 \times 10^{19}$ $cm^{-3}$ is prepared. The $n^+$-type silicon carbide substrate 1 may have a main surface that is, for example, a (000-1) face having a 4-degree off angle in a <11-20> direction.

On the (000-1) face of the $n^+$-type silicon carbide substrate 1, the n-type silicon carbide epitaxial layer 2 having a thickness of 10 μm and doped with nitrogen to have an impurity concentration of about $1.0 \times 10^{16}$ $cm^{-3}$ is formed by epitaxial growth.

On a surface of the n-type silicon carbide epitaxial layer 2, a mask having desired openings is formed by photolithography using, for example, a resist. Further, a p-type impurity, for example, aluminum atoms, is ion implanted using the resist mask as a mask. As a result, in portions of a surface region of the n-type silicon carbide epitaxial layer 2, the $p^+$-type regions 10 are formed. Next, the mask used at the time of ion implantation for forming the $p^+$-type regions 10 is removed.

Next, on the surface of the n-type silicon carbide epitaxial layer 2, the p-type silicon carbide epitaxial layer 11 having a thickness of, for example, 0.5 μm is formed by epitaxial growth. Here, for example, the epitaxial growth may be performed so that the impurity concentration of the p-type silicon carbide epitaxial layer 11 becomes $2.0 \times 10^{16}$ $cm^{-3}$.

On a surface of the p-type silicon carbide epitaxial layer 11, a mask having desired openings is formed by photolithography using, for example, a resist. Here, the mask is formed having no opening directly beneath the triple junction portion where the plating film 16, the protective film 15, and the source electrode 8 formed later are in contact with each other. Subsequently, an n-type impurity, for example, nitrogen, is ion implanted using this resist mask as a mask. As a result, the $n^+$-type source region 4 is formed in portions of the surface region of the p-type silicon carbide epitaxial layer 11. However, the $n^+$-type source region 4 is not formed on the p-type silicon carbide epitaxial layer 11 directly beneath the triple junction portion. Next, the mask used at the time of ion implantation for forming the $n^+$-type source regions 4 is removed.

Next, on the surface of the p-type silicon carbide epitaxial layer 11, a mask having desired openings is formed by photolithography using, for example, a resist. Here, a mask is used having an opening directly beneath the triple junction portion where the plating film 16, the protective film 15, and the source electrode 8 formed later. Subsequently, a p-type impurity, for example, aluminum, is ion implanted using this resist mask as a mask. As a result, the $p^{++}$-type contact region 5 is formed in portions of the surface region of the p-type silicon carbide epitaxial layer 11. Next, the mask used at the time of ion implantation for forming the $p^{++}$-type contact regions 5 is removed.

Next, on the surface of the p-type silicon carbide epitaxial layer 11, a mask having desired openings is formed by photolithography using, for example, a resist. Subsequently, an n-type impurity, for example, nitrogen, is ion implanted using this resist mask as a mask. As a result, the n-type well region 12 is formed in portions of the surface region of the p-type silicon carbide epitaxial layer 11. Next, the mask used at the time of ion implantation for forming the n-type well region 12 is removed.

Next, heat treatment (annealing) for activating the $n^+$-type source regions 4, the $p^{++}$-type contact regions 5, and the n-type well regions 12 is performed. Here, the temperature and duration of the heat treatment may be 1620 degrees C. and 2 minutes, respectively.

The sequence in which the n+-type source regions 4, the p++-type contact regions 5, and the n-type well regions 12 are formed may be varied.

Next, the front surface side of the silicon carbide semiconductor base is subject to thermal oxidation and the gate insulating film 6 having a thickness of 100 nm is formed. The thermal oxidation may be performed by heat treatment in a mixed atmosphere of oxygen ($O_2$) and hydrogen ($H_2$) at a temperature of 1000 degrees C. As a result, regions formed on surfaces of the p-type silicon carbide epitaxial layer 11 and the n-type silicon carbide epitaxial layer 2 are covered by the gate insulating film 6.

Next, on the gate insulating film 6, a polycrystalline silicon layer doped with, for example, phosphorus (P), is formed as the gate electrode 7. Next, the polycrystalline silicon layer is patterned and selectively removed, leaving the polycrystalline silicon layer on a portion of the p-type silicon carbide epitaxial layer 11 between the n+-type source region 4 and the n-type well region 12. Here, the polycrystalline silicon layer may be left on the n-type well region 12. The polycrystalline silicon layer that remains becomes the gate electrode 7.

Next, the BPSG film 100 is formed as the interlayer insulating film 13 so as to cover the gate electrode 7. For example, borophosphosilicate glass (BPSG) having a thickness of 1.0 μm is deposited. Next, a reflow process is performed to planarize the BPSG film 100. After the reflow process, the BPSG film 100 is selectively removed, forming contact holes.

Next, the Ti film 20 and the Al—Si film 21 are formed as the source electrode 8. For example, the Ti film 20 is formed by sputtering and the Al—Si film 21 is formed on the Ti film 20 by sputtering.

Next, on a surface (rear surface of the silicon carbide semiconductor base) of the n+-type silicon carbide substrate 1, for example, a nickel film is deposited as the drain electrode 9. Subsequently, for example, heat treatment at a temperature of 970 degrees C. is performed, forming an ohmic contact of the n+-type silicon carbide substrate 1 and the drain electrode 9.

Next, on a surface of the nickel film, for example, titanium, nickel (Ni), and gold (Au) are sequentially deposited as the drain electrode 9. Next, the protective film 15 of the front surface side of the silicon carbide semiconductor base is selectively formed on the source electrode 8.

Next, using the protective film 15 as a mask, the plating film 16 is selectively formed on the source electrode 8, at portions where the protective film 15 is not present. As a result, the plating film 16 is formed on the source electrode 8 without plating flowing into the edge termination structure region. Next, for example, a polymer resin or the like is used, and the second protective film 17 is selectively formed so as to cover a portion where the plating film 16 and the protective film 15 are adjacent to each other.

Next, the protective film 15 and the second protective film 17 are used as a mask when applying solder and the pin-shaped electrode 18 is formed on the plating film 16 via the solder 19, thus, completing the MOSFET depicted in FIG. 1.

As described, according to the embodiment, no channel is formed directly beneath the triple junction portion where the plating film, the protective film, and the source electrode are in contact with each other. As a result, no current flows in a portion where stress concentrates, suppressing degradation of semiconductor device characteristics resulting from the portion subject to the concentration of stress. Therefore, decreases in the reliability of the semiconductor device are suppressed. Further, since no current flows in the portion where stress concentrates, for example, even when the interlayer insulating film directly beneath the triple junction portion cracks, the semiconductor device is prevented from failing consequent to the gate electrode and the source electrode short circuiting.

In the embodiment, although a MOSFET has been described as an example, without limitation hereto, the present invention is applicable to semiconductor devices of various configurations such as MOS-type semiconductor devices like IGBTs, semiconductor devices of a configuration in which stress concentrates at an element structure consequent to a step portion of the interlayer insulating film, and the like. Further, in the embodiment, although a case in which silicon carbide is used as a wide bandgap semiconductor is described as an example, similar effects are obtained when a wide bandgap semiconductor other than silicon carbide is used, such as gallium nitride (GaN). In the embodiment, although the first conductivity type is assumed to be an n-type and the second conductivity type is assumed to be a p-type, the present invention is similarly implemented when the first conductivity type is a p-type and the second conductivity type is an n-type.

The semiconductor device and the method of manufacturing a semiconductor device according to the present invention achieve an effect in that a semiconductor device may be provided that suppresses degradation of semiconductor device characteristics and has favorable characteristics.

As described, the semiconductor device according to the present invention is useful for high-voltage semiconductor devices used in power converting equipment and power supply devices such as in various industrial machines, and is particularly suitable for silicon carbide semiconductor devices using a pin-shaped electrode as a wiring member to carry the potential of the front electrode to the outside.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a substrate including a first semiconductor material having a bandgap wider than that of silicon, the substrate having a front surface and a rear surface;
    a deposition layer deposited on the front surface of the substrate, and having an impurity concentration lower than that of the substrate, the deposition layer having a first surface and a second surface opposite to each other, the second surface thereof facing the substrate;
    a semiconductor region selectively provided in the deposition layer at a side of the first surface thereof;
    a semiconductor layer provided on the first surface of the deposition layer and a front surface of the semiconductor region, and including a second semiconductor material having a bandgap wider than that of silicon;
    a first region selectively provided in the semiconductor layer and on the first surface of the deposition layer;
    a second region selectively provided in the semiconductor layer;
    a gate electrode provided on the second region and the semiconductor layer via a gate insulating film;
    a source electrode in contact with the semiconductor layer and the second region;
    an interlayer insulating film covering the gate electrode;

a drain electrode provided on the rear surface of the substrate;

a protective film selectively provided on the source electrode;

a plating film selectively provided on the source electrode at portions thereof on which the protective film is not provided; and a pin-shaped electrode connected to the plating film via solder, wherein the semiconductor device is free of the second region directly beneath a triple junction portion where the plating film, the protective film and the source electrode are in contact with one another.

2. The semiconductor device according to claim 1, wherein the substrate, the deposition layer and the first and second regions are of a first conductivity type, and the semiconductor region and the semiconductor layer are of a second conductivity type.

3. A method of manufacturing a semiconductor device, comprising:

providing a substrate including a first semiconductor material having a bandgap wider than that of silicon, the substrate having a front surface and a rear surface;

forming a deposition layer on the front surface of the substrate, the deposition layer having an impurity concentration lower than that of the substrate, the deposition layer having a first surface and a second surface opposite to each other, the second surface thereof facing the substrate;

selectively forming a semiconductor region in the deposition layer at a side of the first surface thereof;

forming a semiconductor layer on the first surface of the deposition layer, the semiconductor layer including a second semiconductor material having a bandgap wider than that of silicon;

selectively forming a first region in the semiconductor layer so as to be on the deposition layer;

selectively forming a second region in the semiconductor layer;

forming a gate electrode on the second region and the semiconductor layer, via a gate insulating film;

forming a source electrode in contact with the semiconductor layer and the second region;

forming an interlayer insulating film covering the gate electrode;

forming a drain electrode on the rear surface of the substrate;

selectively forming a protective film on the source electrode;

selectively forming a plating film on the source electrode, at a portion thereof on which the protective film is not formed; and forming a pin-shaped electrode connected to the plating film via solder, wherein the second region is so selectively formed that the semiconductor device is free of the second region directly beneath a triple junction portion where the plating film, the protective film and the source electrode are in contact with one another.

4. The method according to claim 3, wherein the substrate, the deposition layer and the first and second regions are of a first conductivity type, and the semiconductor region and the semiconductor layer are of a second conductivity type.

* * * * *